(12) United States Patent
Hernandez et al.

(10) Patent No.: US 11,962,316 B2
(45) Date of Patent: Apr. 16, 2024

(54) VCO-ADC WITH FREQUENCY-CONTROLLED SWITCHED-CAPACITOR FEEDBACK FOR LINEARIZATION

(71) Applicant: Infineon Technologies AG, Neubiberg (DE)

(72) Inventors: Luis Hernandez, Madrid (ES); Ruben Garvi Jimenez-Ortiz, Madrid (ES); Andreas Wiesbauer, Poertschach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 298 days.

(21) Appl. No.: 17/451,234

(22) Filed: Oct. 18, 2021

(65) Prior Publication Data

US 2023/0123370 A1 Apr. 20, 2023

(51) Int. Cl.
H03M 1/00 (2006.01)
H03M 1/06 (2006.01)
H03M 1/60 (2006.01)

(52) U.S. Cl.
CPC ....... H03M 1/0604 (2013.01); H03M 1/0614 (2013.01); H03M 1/60 (2013.01); H04R 2201/003 (2013.01)

(58) Field of Classification Search
CPC .... H03M 1/0604; H03M 1/0614; H03M 1/60; H04R 2201/003
USPC .................. 341/126, 155, 172, 143
See application file for complete search history.

(56) References Cited

U.S. PATENT DOCUMENTS

| | | | |
|---|---|---|---|
| 8,378,730 B2 * | 2/2013 | Cho .......................... | H03L 1/00 327/512 |
| 9,182,295 B1 * | 11/2015 | Perrott ..................... | G01K 7/22 |
| 9,379,731 B1 * | 6/2016 | Roham .................. | H03K 21/38 |
| 2022/0286774 A1 * | 9/2022 | Garvi Jimenez-Ortiz .................... | H03M 1/125 |

OTHER PUBLICATIONS

Garvi, Ruben et al., "VCO-ADC linearization by switched capacitor frequency-to-current conversion", IEEE International Symposium on Circuits and Systems (ISCAS), Oct. 12-14, 2020, 5 pages.
Quintero, Andres et al., "A VCO-Based CMOS Readout Circuit for Capacitive MEMS Microphones", MDPI Sensors, www.mdpi.pi.com/journal/sensors, Sep. 24, 2019, 17 pages.
Quintero, A., et al., "A Coarse-Fine VCO-ADC for MEMS Microphones With Sampling Synchronization by Data Scrambling," in IEEE Solid-State Circuits Letters, vol. 3, Jan. 6, 2020, pp. 29-32, doi: 10.1109/LSSC.2020.2964158.
Zhao, Wenda et al., "A 0.025-mm2 0.8-V 78.5dB-SNDR VCO-Based Sensor Readout Circuit in a Hybrid PLL-?SM Structure," IEEE Journal of Solid-State Circuits, vol. 55, No. 3, Mar. 2020, 14 pages.

* cited by examiner

*Primary Examiner* — Peguy Jean Pierre
(74) *Attorney, Agent, or Firm* — Slater Matsil, LLP (57) ABSTRACT

An analog-to-digital converter (ADC) includes a first controlled oscillator (CO) for generating at least one phase signal, and wherein the at least one phase signal generates a first output signal of the ADC; and at least one first frequency-controlled resistor (FDR) for receiving the at least one phase signal generated by the first CO, wherein the first CO and the at least one first FDR are coupled together at a first subtraction node of the ADC, and wherein the first subtraction node receives a first input signal.

20 Claims, 10 Drawing Sheets

VCO-ADC WITH FREQUENCY-CONTROLLED SWITCHED-CAPACITOR FEEDBACK FOR LINEARIZATION

TECHNICAL FIELD

The present invention relates generally to a voltage-controlled oscillator (VCO) analog-to-digital (ADC) with switched-capacitor feedback for linearization, and, in particular embodiments, to a system and method for.

BACKGROUND

Digital microphones can be housed in a semiconductor package including a MEMS capacitive sensor, an analog-to-digital converter (ADC), supporting circuitry to bias the MEMS sensor and to provide a digital interface.

Classical microphone ADCs can be implemented as switched-capacitor sigma-delta modulators. Market trends demand that the power consumption and dynamic range of these ADCs be improved to facilitate new applications in mobile and Internet of Things (IoT) devices, such as always-on voice monitoring. In addition, these new applications include embedding the microphone in a high density System on Chip (SoC) along with other digital computation-intensive functions. These SoC components are ideally implemented in deep submicron CMOS processes that may not be fully compatible with switched-capacitor sigma-delta modulator ADCs.

SUMMARY

According to an embodiment, an analog-to-digital converter (ADC) includes a first controlled oscillator (CO) configured for generating at least one phase signal, and wherein the at least one phase signal is configured for generating a first output signal of the ADC; and at least one first frequency-controlled resistor (FDR) configured for receiving the at least one phase signal generated by the first CO, wherein the first CO and the at least one first FDR are coupled together at a first subtraction node of the ADC, and wherein the first subtraction node is configured for receiving a first input signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Embodiments of the present invention comprise a VCO including an analog feedback loop having improved linearity characteristics. In one example, the VCO includes an oscillator whose frequency is proportional to a voltage provided at an input node. A feedback current proportional to the oscillation frequency of the oscillator is subtracted from the input node via a frequency dependent resistor. Thus, when an input voltage is applied to the input node via a resistor, the current feedback serves to linearize the output frequency versus applied input voltage characteristic of the VCO. In a specific implementation, the VCO is implemented using a ring oscillator (RO) having a plurality of inverter stages coupled in a ring configuration. The output of one of more stages of the ring oscillator is coupled to a control node of a corresponding frequency dependent resistor (FDR) coupled in parallel with the plurality of inverter stages. In some embodiments, the frequency dependent resistor may be implemented using a switched capacitor resistor. For greater understanding, however, block diagrams of a digital microphone, an open-loop VCO-ADC, and a closed-loop VCO-ADC are described immediately below.

Figure 1:
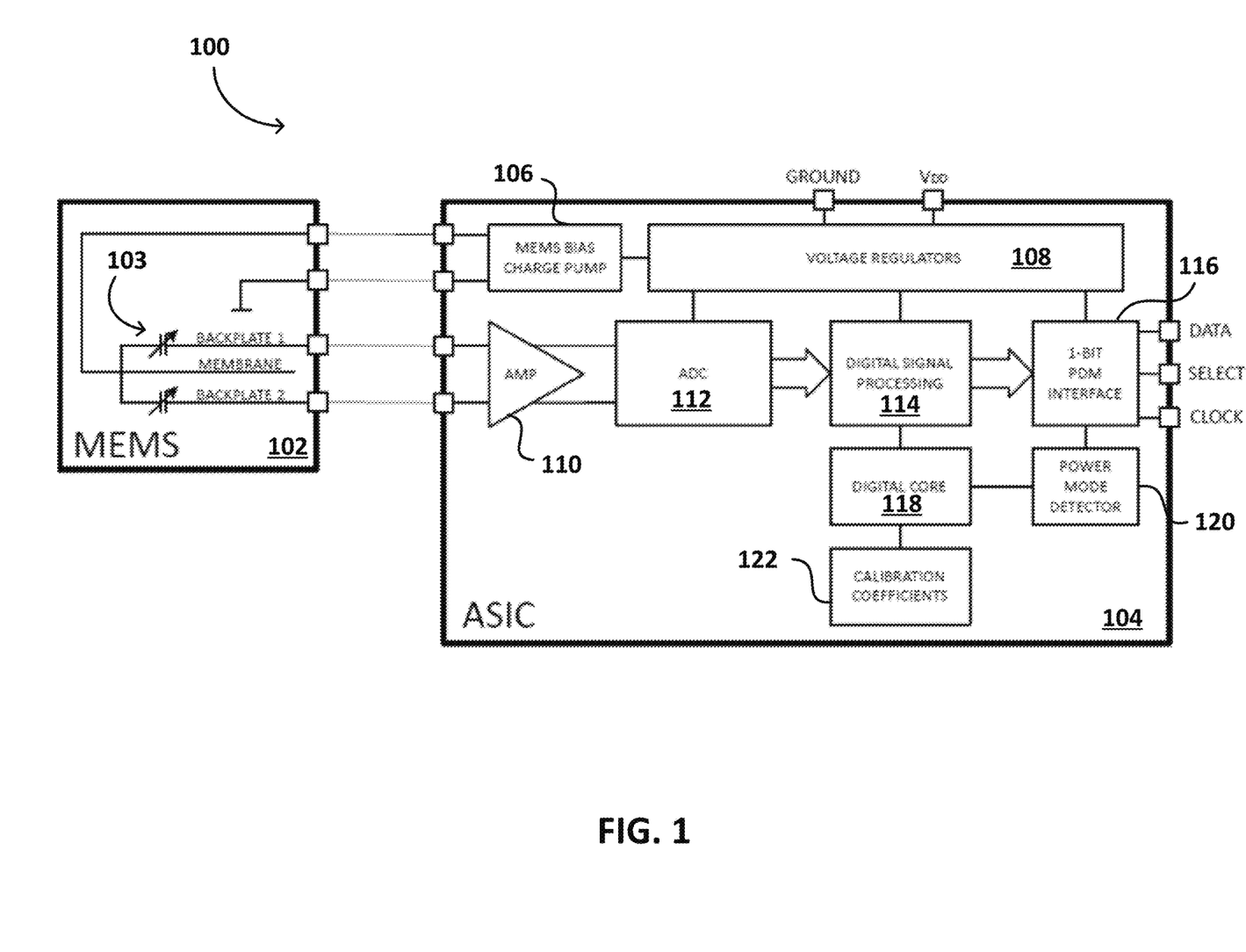
FIG. 1 is a block diagram of an exemplary digital microphone.

FIG. 1 is a block diagram of an exemplary digital microphone 100 including a MEMS device 102, and an application-specific integrated circuit (ASIC) 104. MEMS device 102 includes a capacitive device 103 that generates analog voltages on the BACKPLATE 1 and BACKPLATE 2 pins, and receives a bias voltage on the MEMBRANE pin. MEMS device 102 can be biased using high ohmic resistors (not shown in FIG. 1). ASIC 104 comprises an integrated circuit that includes a MEMS bias charge pump 106 for generating bias voltages, voltage regulators 108 for supply regulated supply voltages to various ASIC components, an amplifier no for receiving an amplifying analog voltages received from MEMS device 102, and an ADC 112 for converting the amplified analog voltage into a digital signal. ASIC 104 also includes other digital signal processing components 114 for processing the digital signal, and a one-bit pulse density modulation (PDM) interface 116 coupled to the DATA, SELECT, and CLOCK pins. Additional digital circuitry and storage is included in a digital core component 118 coupled to a power mode detector 120, and a calibration coefficients component 122. Additional components can be used or some components can be omitted in the block diagram of digital microphone 100. Different components can also be used. For example, MEMS device 102 can include different configurations of membranes and backplates.

Figure 2A:
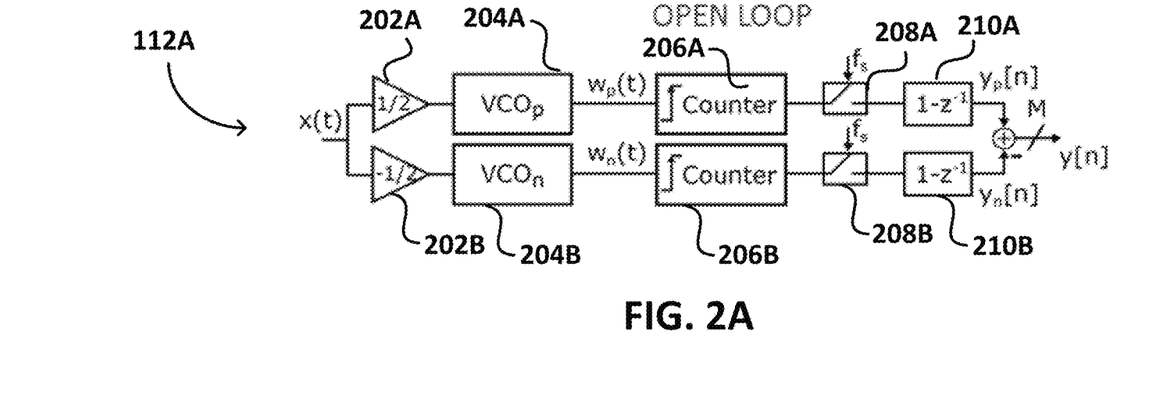
FIG. 2A is a block diagram of an open loop VCO-ADC, according to an embodiment.

In some embodiments, ADC 112 can include a VCO-ADC, which can comprise an open loop VCO-ADC or a closed loop VCO-ADC. FIG. 2A, described below, is a block diagram of an open loop VCO-ADC 112A, and FIG. 2B, described below, is a block diagram of a closed loop VCO-ADC 112B.

VCO-ADC 112A comprises an input x(t) for receiving an analog input voltage, and an output y[n] for providing an "M" bit digital output signal, wherein M is an integer greater than one. A first amplifier 202A provides a gain of ½ to the analog input voltage and a second amplifier 202B provides a gain of −½ to the analog input voltage, in an embodiment. A first VCO 204A, designated $VCO_p$ is coupled to first amplifier 202A for generating a corresponding first plurality of phase signals $w_p(t)$. A second VCO 204B, designated $VCO_n$ is coupled to second amplifier 202B for generating a corresponding second plurality of phase signals $w_n(t)$. A first counter 206A generates a first count of the first plurality of phase signals. A second counter 206B generates a second count of the second plurality of phase signals. A first switch 208A is used to switch the first count under control of a sampling frequency $f_s$. A second switch 208B is used to switch the second count under control of the sampling frequency $f_s$. The output of first switch 208A is coupled to a first inverse Z transform component 210A to generate the $y_p[n]$ signal. The output of second switch 208B is coupled to a second inverse Z transform component 210B to generate the $y_n[n]$ signal. The $y_n[n]$ signal is subtracted from the $y_p[n]$ signal to generate the y[n] digital output signal. First counter 206A, second counter 206B, first switch 208A, second switch 208B, first inverse Z transform component 210A, and second inverse Z transform component 210B comprise a "frequency-to-digital" converter (or "F2D" converter) for converting the phase signals generated by first VCO 204A and second VCO 204B into a digital output signal. Other F2D converters are known in the art, and any appropriate F2D converter can be used in different embodiments.

Figure 2B:
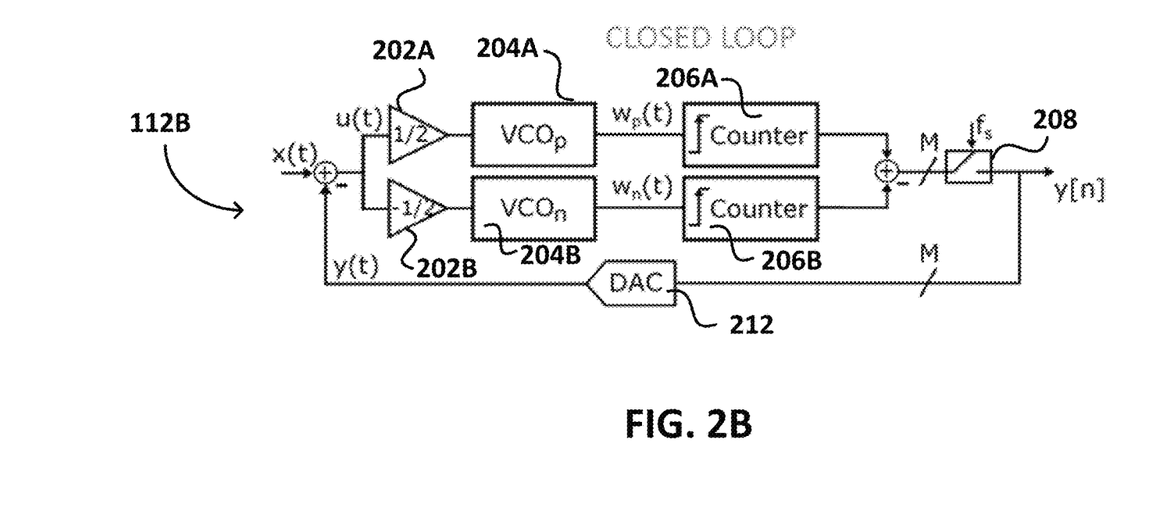
FIG. 2B is a block diagram of a closed loop VCO-ADC, according to an embodiment.

VCO-ADC 112B comprises an input x(t) for receiving an analog input voltage, and an output y[n] for providing an "M" bit digital output signal, wherein M is an integer greater than one, as well as internal signals u(t) and y(t). First amplifier 202A provides a gain of ½ to the internal signal u(t) and a second amplifier 202B provides a gain of −½ to the internal signal u(t), in an embodiment. First VCO 204A, designated $VCO_p$ is coupled to first amplifier 202A for generating a corresponding first plurality of phase signals $w_p(t)$. Second VCO 204B, designated $VCO_n$ is coupled to second amplifier 202B for generating a corresponding second plurality of phase signals $w_n(t)$. First counter 206A generates a first count of the first plurality of phase signals. Second counter 206B generates a second count of the second plurality of phase signals. The first and second counts are summed together to form an M bit count. A switch 208 is used to switch the M bit count under control of a sampling frequency $f_s$. The output of switch 208 generates the digital output signal. The output of switch 208 is coupled to the input of Digital-to-Analog Converter (DAC) 212, which comprises a feedback loop. The output of DAC 212 generates internal signal y(t). The y(t) internal signal is subtracted from input x(t) to generate the u(t) internal signal. First counter 206A, second counter 206B, and switch 208 comprises a "frequency-to-digital" converter (or "F2D" converter) for converting the phase signals generated by first VCO 204A and second VCO 204B into the digital output signal. Other F2D converters are known in the art, and any appropriate F2D converter can be used in different embodiments.

The ADC architectures shown in FIGS. 2A and 2B are based on Voltage-Controlled Oscillators (VCOs). In these types of converters, the low level voltage provided by the capacitive MEMS device is applied to a VCO implemented with a Ring Oscillator (RO) made of digital inverters, as will be explained in further detail below. As was previously explained, these types of converters are designated VCO-ADCs. One advantage of VCO-ADCs relies in its implementation using mostly digital circuits (such as the RO inverters) which permits partially synthesizing the circuit using digital tools and enables the implementation in a deep submicron CMOS process.

As was shown in FIGS. 2A and 2B, there are two types of VCO-ADCs, open loop and closed loop. Open loop VCO-ADCs modulate the VCO with the input signal and measure the output frequency with a frequency-to-digital converter. Closed loop VCO-ADCs use the VCO as the integrator of a first order sigma-delta modulator and place a sampled feedback loop around the VCO.

In embodiments, VCO-ADC digital microphones are fabricated using either open loop or closed loop VCO-ADCs. In some embodiments, the open loop topology is selected due to its very large dynamic range, simplicity, jitter insensitivity and possibility to connect to the MEMS device without any preamplifier. However, an open loop VCO-ADC strongly affected by the distortion caused by the nonlinear tuning curve of the VCO, which relates the output frequency to the input voltage. In addition, open loop VCO-ADCs make them sensitive to flicker noise in the VCO. In some situations, flicker noise may be mitigated by increasing the number of inverters in the RO, which may complicate the digital circuitry used in the digital microphone.

Embodiments advantageously employ a novel VCO architecture that uses a switched capacitor circuit clocked by an oscillator implementing an analog feedback loop around the VCO. The distortion and noise are improved as in a feedback amplifier by the loop gain, which in this case resorts to the VCO gain constant $K_{VCO}$. The VCO architecture described herein advantageously does not require an operational amplifier, in some embodiments, and is as jitter tolerant as an open loop VCO-ADC. In other embodiments, an intermediate stage can be used to boost $K_{VCO}$, which can include an operational amplifier in other embodiments. The VCO architecture described herein is advantageously compatible with deep submicron CMOS semiconductor processes can also advantageously accommodate a reduced number of taps in the RO (fewer inverters) because flicker noise is attenuated by the loop gain. Another advantage of the embodiment architecture is that it allows the stabilization of $K_{VCO}$ over temperature and pressure, as well as stabilization over other external environmental factors.

Figure 3A:
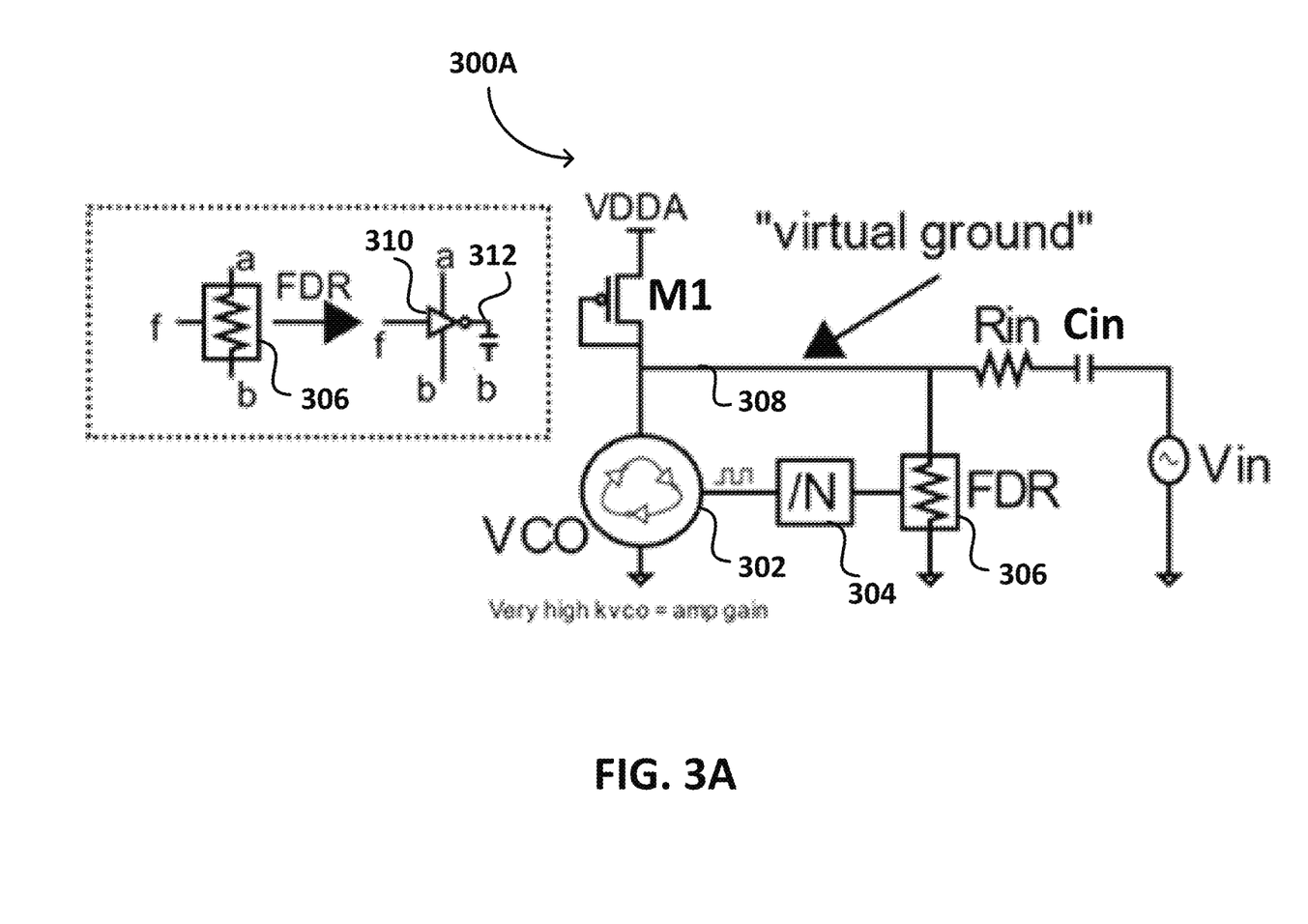
FIG. 3A is a schematic diagram of a VCO including an analog feedback loop for use in a VCO-ADC, according to an embodiment.

FIG. 3A is a schematic diagram of a VCO circuit including an analog feedback loop for use in a VCO-ADC, according to an embodiment. The frequency-to-digital converter is omitted for clarity. VCO circuit 300A includes a RO-VCO 302 biased through MOS transistor $M_1$ in a diode configuration (gate of transistor $M_1$ coupled to the drain of transistor $M_1$). RO-VCO 302 is coupled between the drain of transistor $M_1$ at node 308, which is a virtual ground node, and a reference voltage (ground). Node 308 is also a feedback node or a subtraction node as will be explained in further detail below. The source of transistor $M_1$ is coupled to the analog supply voltage source VDDA. The input voltage $V_{IN}$ to VCO circuit 300 is applied to a serially coupled input capacitor $C_{in}$ and input resistor $R_{in}$. Resistor $R_{in}$ is coupled to node 308. The analog feedback loop of VCO circuit 300 comprises a Frequency Dependent Resistor (FDR) 306 coupled between node 308 and ground and a digital divider 304. Digital divider 304 is shown as an "N" divider, which divides an input frequency by a factor of "N", which in some embodiments can be an integer greater than one. The output of RO-VCO 302 is coupled to the input of digital divider 304, and the output of digital divider 304 is coupled to a control input of FDR 306.

Figure 5:
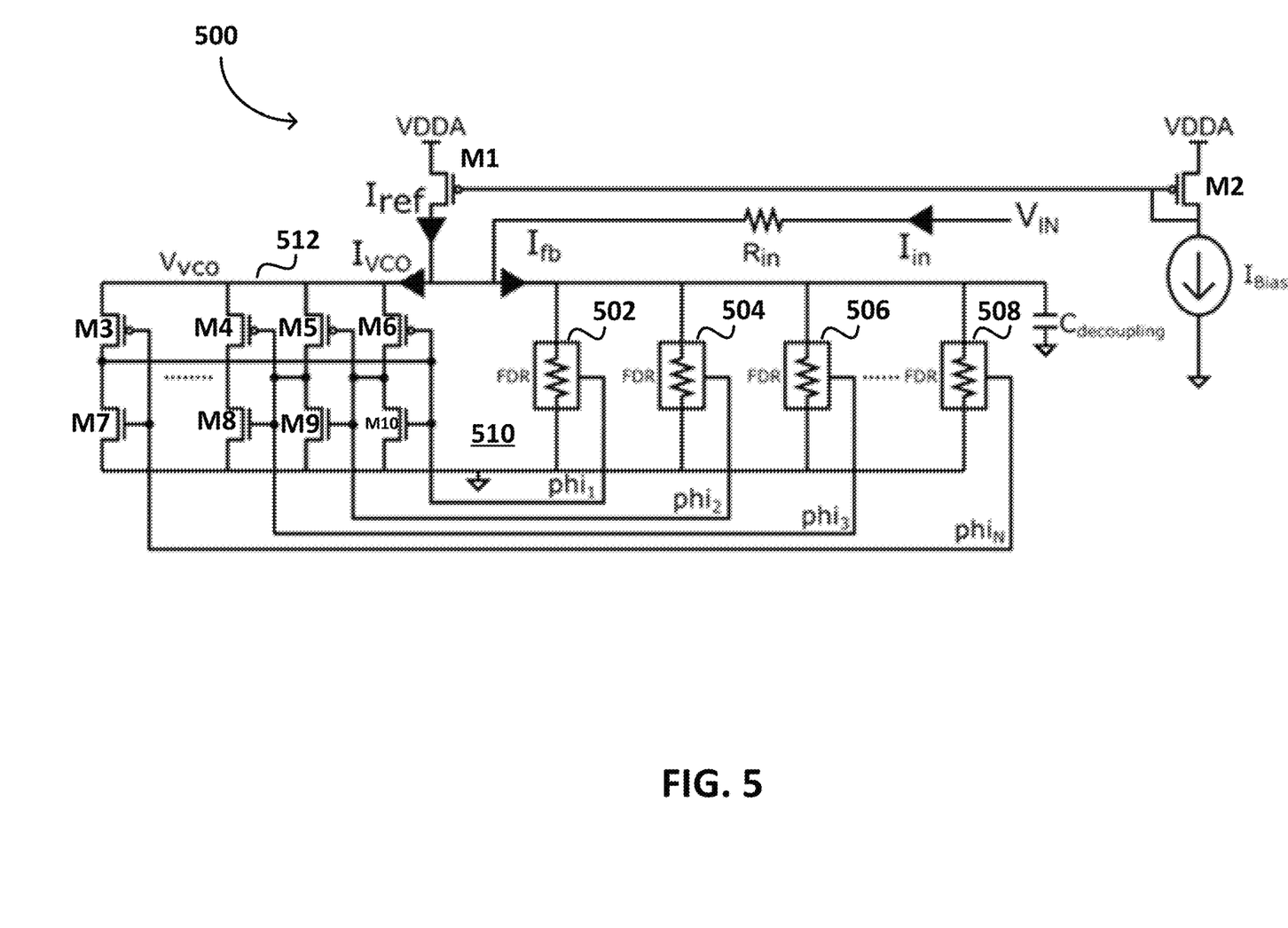
FIG. 5 is a transistor-level schematic diagram of a VCO including an analog feedback loop for use in a VCO-ADC, according to an embodiment.
Figure 6:
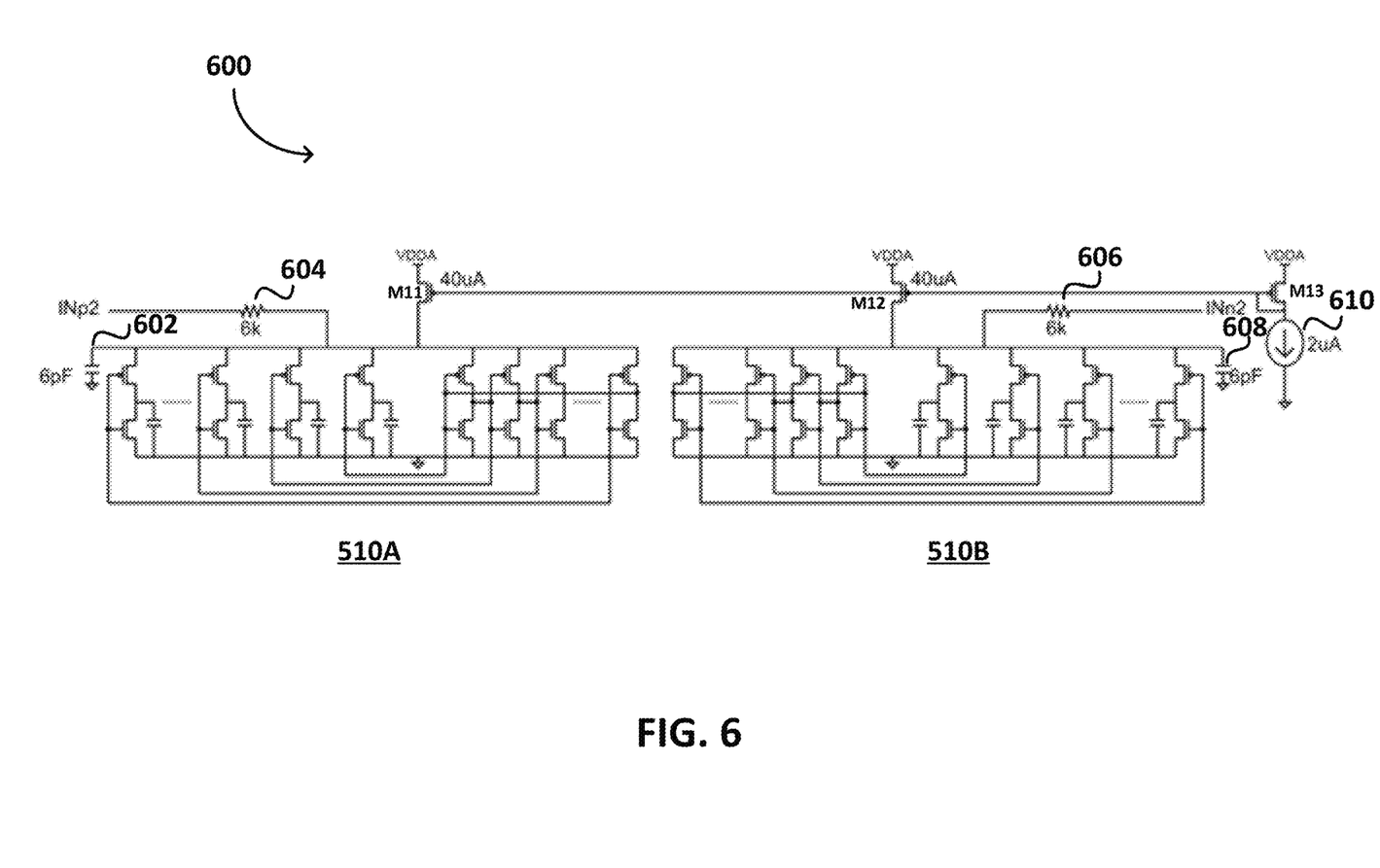
FIG. 6 is another transistor-level schematic diagram of a VCO including an analog feedback loop for use in a VCO-ADC, according to an embodiment.

The upper left portion of FIG. 3A shows a detail of FDR 306, wherein the resistor component is coupled between nodes "a" and "b". The control input of FDR is labeled node "f". A gate-level implementation of FDR 306 is shown as including inverter 310, wherein the input of inverter 310 is coupled to node "f". In an embodiment, inverter 310 comprises a CMOS inverter including a PMOS transistor and an NMOS transistor. Examples of the CMOS inverter are best seen in FIG. 5 and FIG. 6, and described in detail below. The power supply terminals of inverter 310 are coupled between nodes "a" and "b". A capacitor 312 is coupled to the output of inverter 310. In operation, the average current flowing through FDR 306 between nodes "a" and "b" is directly proportional to the frequency at the control input at node "f" provided that the voltage between nodes "a" and "b" has a small variation.

In operation, RO-VCO 302 is biased through a MOS diode (or a current source), such as diode-connected transistor $M_1$ as previously described. The frequency of VCO circuit 300 is converted into a current by a Frequency Dependent Resistor (FDR) 306 whose circuit is an inverter loaded with a fixed capacitor as previously described. The use of FDR 306 creates a virtual ground node 308 as the current of the current source (transistor $M_1$) splits between the current of the RO-VCO 302 and the current through the FDR 306. If the frequency of RO-VCO 302 increases, the current through the FDR 306 increases, which detracts current from the RO-VCO 302, which then decreases the frequency. This manner of operation creates a negative feedback loop. The input signal $V_{IN}$ is applied as a current through a transconductor (described in further detail below) or through a resistor $R_{in}$ as a voltage. Optionally, digital divider 304 can be inserted to accommodate different feedback ratios using different division constants "N". Since sampling occurs on the VCO output, the dedicated DAC shown in FIG. 2B that is synchronized to a sampling clock can be omitted in some embodiments.

Figure 3B:
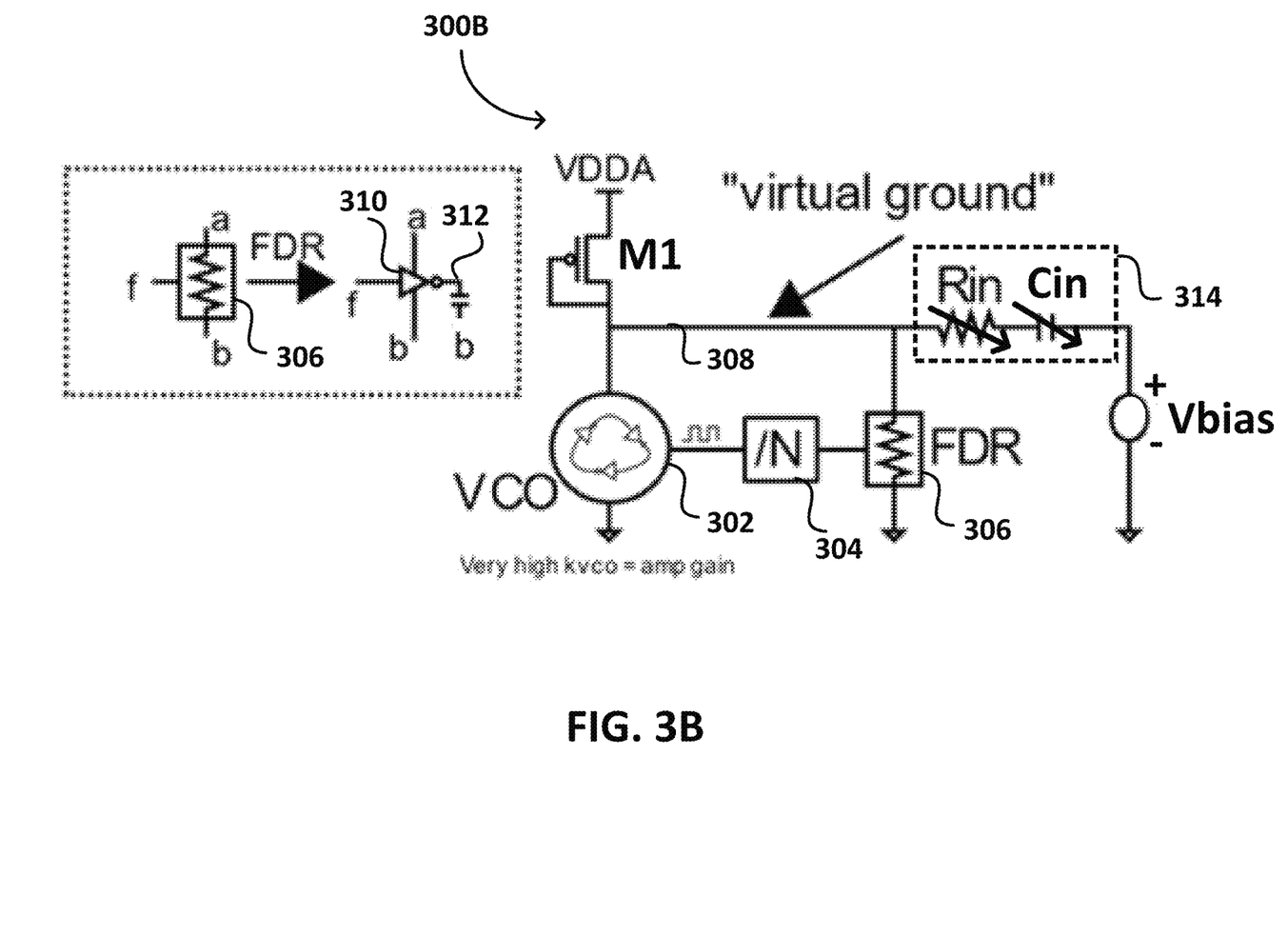
FIG. 3B is a schematic diagram of a VCO including an analog feedback loop for use in a VCO-ADC, according to another embodiment.

In FIG. 3A and input resistor $R_{IN}$ and/or an input capacitor $C_{IN}$ are coupled between node 308 and receive an input voltage $V_{IN}$ that can be provided by an AC input voltage generator in an embodiment. In the example of FIG. 3A input resistor $R_{IN}$ and/or input capacitor $C_{IN}$ are fixed value components. In another embodiment, shown in VCO circuit 300B of FIG. 3B, input resistor $R_{IN}$ and/or input capacitor $C_{IN}$ can be components of a sensor 314 coupled between node 308 and a bias voltage generator for generating the $V_{BIAS}$ bias voltage. The output of sensor 314 can be a voltage or a current, in embodiments. The other components shown in VCO circuit 300B of FIG. 3B are the same as shown in FIG. 3A, and all have been previously described. The frequency-to-digital converter is also omitted in FIG. 3B for clarity. Sensor 314 can include a variable input resistor $R_{IN}$ and/or a variable input capacitor $C_{IN}$, wherein the value of the variable resistor $R_{IN}$ and/or variable capacitor $C_{IN}$ changes in response to external inputs to the sensor. Sensor 314 can comprise a MEMS microphone (MIC-MEMS), a pressure-sensitive MEMS device, or a temperature dependent resistor, in some embodiments. Other sensors can also be used. Sensor 314 receives one or more biasing voltages from the constant source of bias voltage $V_{BIAS}$, in an embodiment.

Figure 4:
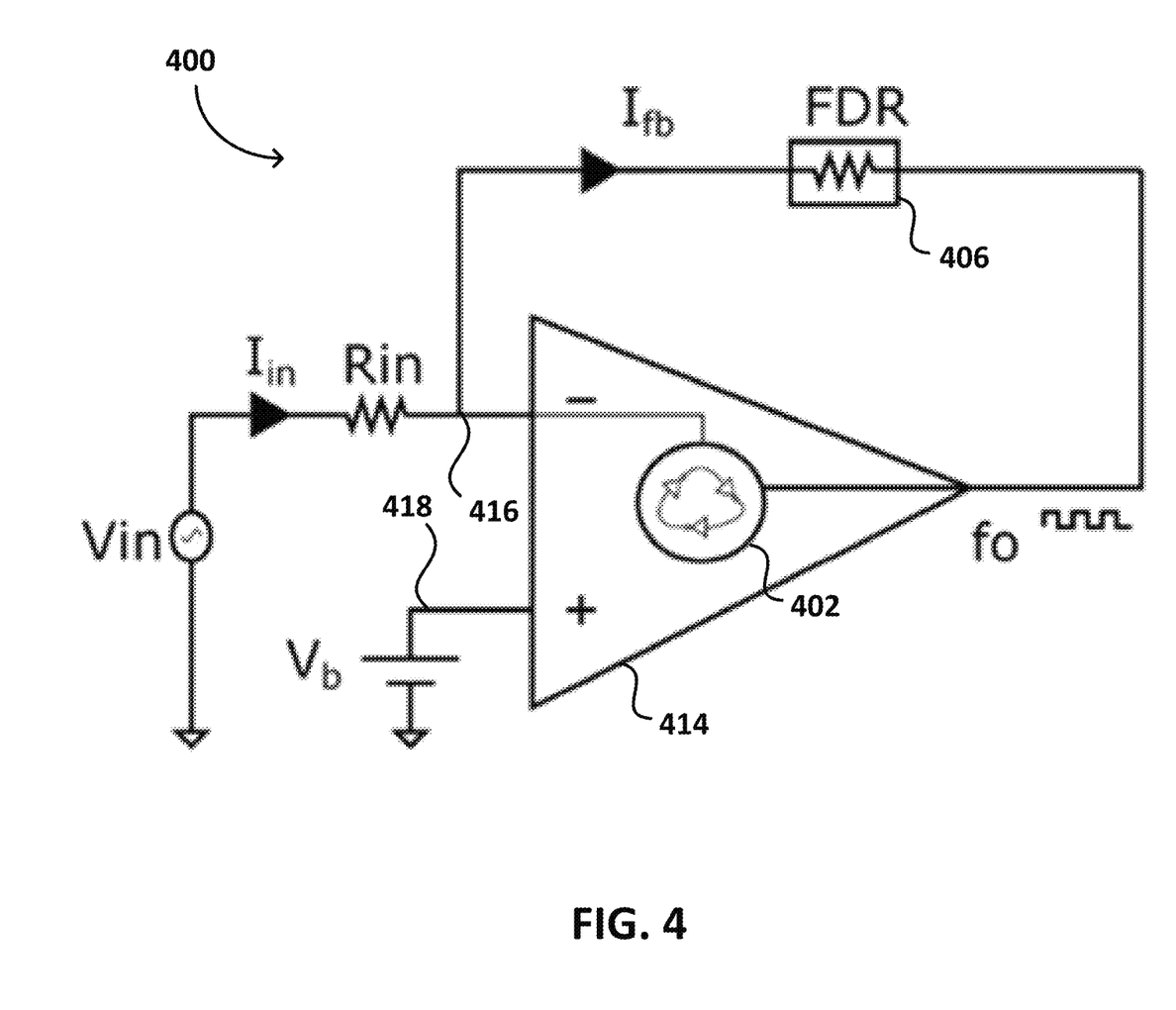
FIG. 4 is a high-level schematic diagram of a VCO including an analog feedback loop for use in a VCO-ADC, according to an embodiment.

FIG. 4 shows an embodiment VCO circuit 400, whose operational principles are applicable to other embodiments described herein. For example, the VCO circuit 300 of FIG. 3A could be understood according to the principles described with respect to VCO circuit 400 of FIG. 4. VCO circuit 400 is represented as an operational amplifier 414 in an inverting configuration, where the output of the operational amplifier is encoded in frequency ($f_o$), the inputs are configured to sense voltages, and wherein the open loop gain of the operational amplifier is equal to $K_{VCO}$.

FIG. 4 thus shows a VCO circuit 400 including an inverting amplifier 414 having a RO-VCO 402 coupled between the negative input 416 and the output of the inverter amplifier. An FDR 406 is coupled between the negative input 416 and the output of inverting amplifier 414. The negative input 416 is a subtraction node. The input voltage $V_{IN}$ is applied to input resistor $R_{in}$, which is in turn coupled to the negative input 416 of inverting amplifier 414. The positive input 418 of inverting amplifier 414 is coupled to a bias voltage source $V_b$. The input current through input resistor $R_{in}$ is designated $I_{in}$, and the portion of the current flowing through FDR 406 is designated $I_{fb}$ (feedback current). In operation, a ring oscillator such as those shown in FIGS. 3A and 3B, and in FIG. 4 with "N" inverters has N phases $\Phi_1$ to $\Phi_N$. Each of the oscillator phases is connected to another inverter (comprising an FDR) in parallel with the ring oscillator, loaded with a capacitor C as previously described (capacitor 312 in FIGS. 3A and 3B). The following analysis assumes that the ring oscillator and the FDR are at a common supply voltage $V_{VCO}$, which is a virtual ground node. Each time an oscillator phase $\Phi_i$ toggles, a charge equivalent to $V_{VCO}*C$ coulombs is drawn from node $V_{VCO}$ to ground. If the oscillator frequency is $f_o$, the total average current drawn from node $V_{VCO}$ by the FDR array is $I_{fb}=V_{VCO} \cdot N \cdot C \cdot f_o$. Assuming the oscillator to be linear, the oscillator frequency is given by the following equation: $f_o=K_{VCO} \cdot I_{bias}$, wherein $I_{bias}$ is the current through the ring oscillator and $K_{VCO}$ is the current-to-frequency conversion constant of the oscillator. The input current $I_{in}$ can be calculated as:

$$I_{in} = \frac{(V_{IN} - V_{VCO})}{R_{in}}$$

Assuming that $K_{VCO}$ is very large, $V_{VCO}$ will be nearly constant and the output frequency $f_o$ is given by the following equation:

$$f0 \approx \frac{(I_{ref} + I_{in})}{(N \cdot C \cdot V_{VCO})} = frest + \frac{(V_{IN} - V_{VCO})}{(N \cdot C \cdot V_{VCO})R_{in}},$$

where $f_{rest}$ is the rest frequency of the VCO. Capacitor $C_{decoupling}$ helps to attenuate the residual ripple voltage of $V_{VCO}$ due to the discontinuous current flowing through the FDR. The decoupling capacitor as well as other circuit implementation details are shown and described below with respect to the transistor-level schematic diagrams of FIG. 5 and FIG. 6.

Distortion in the tuning curve of the VCO is corrected by the negative feedback produced by the FDRs. The amount of correction of the tuning curve of the VCO is related to the $K_{VCO}$ gain value. In some embodiments, phase noise (especially flicker) is compensated because the charge transferred in the FDR happens through switches that operate in the triode region. Any number of inverters can be used in the oscillator. In some embodiments, a small odd number of inverters are used. Grouping phases in multiple FDRs is used in some embodiments. The use of multiple FDRs advantageously allows the ripple in $V_{VCO}$ to be much smaller, and also advantageously allows the use to a smaller decoupling capacitor and smaller FDR capacitors C. The use of multiple FDRs reduces the amount of current flowing through each FDR capacitor C, which therefore reduces ripple in $V_{VCO}$. While a multiple phase VCO is shown and described herein, a single phase embodiment can still be used in some applications.

While FIGS. 3A, 3B and 4 show high level representations of a VCO including an analog feedback path, according to embodiments, other such high level representations are possible. Transistor-level schematics of a VCO including an analog feedback are shown in FIG. 5 and FIG. 6 are described below.

FIG. 5 is a transistor-level schematic diagram of a VCO including an analog feedback loop for use in a VCO-ADC, according to an embodiment. VCO circuit 500 includes a RO-VCO including a plurality of inverters coupled in a ring oscillator configuration, wherein the output an inverter is coupled to the input of a subsequent inverter in the ring of inverters. The RO-VCO includes a first inverter comprising a PMOS transistor M3 and an NMOS transistor M7; a second inverter comprising a PMOS transistor M4 and an NMOS transistor M8; a third inverter comprising a PMOS transistor M5 and an NMOS transistor M9; and a fourth ($N^{th}$) inverter comprising a PMOS transistor M6 and an NMOS transistor M7. While four inverters are shown in FIG. 5 for simplicity of illustration, it will be appreciated by those skilled in the art that any number of inverters may be used. However, in some embodiments, a low number of inverters can still be used while maintaining an acceptable level of linearity. The output of the first inverter generates a first phase signal $phi_1$, the output of the second inverter generates a second phase signal $phi_2$, the output of the third inverter generates a third phase signal $phi_3$, and the output of the fourth ($N^{th}$) inverter generates a fourth phase signal phi N. The number of phase signals is equal to the number of inverters, in an embodiment.

In FIG. 5, a plurality of FDRs 502, 504, 506, and 508 each receive one of the phase signals for controlling the resistance value of the FDR. For example, FDR 502 is controlled by the $ph_1$, phase signal, FDR 504 is controlled by the $phi_2$ phase signal, FDR 506 is controlled by the $phi_3$ phase signal, and FDR 508 is controlled by the phi N phase signal. The number of phase signals, the number of inverters, and the numbers of FDRs are all equal, in an embodiment.

The inverters and the FDRs described above comprise a VCO cell 510. VCO cell 510 is coupled between node 512 ($V_{VCO}$) and ground. Node 512 is variously described herein as a virtual ground node, a feedback node, or a subtraction node. VCO cell 510 receives a reference current $I_{ref}$ and an input current $I_{in}$. The total current of $I_{ref}$ plus $I_{in}$ is split into the VCO current $I_{VCO}$, and the FDR current $I_{fb}$ (feedback current), as previously described. The reference current $I_{ref}$ is generated by a current mirror including PMOS transistors $M_1$ and $M_2$, in a current mirror configuration. The output of the current mirror generates the $I_{ref}$ reference current, and the input of the current mirror receives the $I_{Bias}$ bias current. The current mirror including transistors $M_1$ and $M_2$ can have a unity gain, in an embodiment. The sources of transistors $M_1$ and $M_2$ are coupled to the analog supply voltage source VDDA, in an embodiment. The input current $I_{in}$ is generated by the voltage difference between the input voltage $V_{IN}$ and the $V_{VCO}$ voltage at node 512 across input resistor $R_{in}$. Finally, a decoupling capacitor $C_{decoupling}$, is coupled between node 512 and ground.

FIG. 6 is another transistor-level schematic diagram of a VCO including an analog feedback loop for use in a VCO-ADC, according to an embodiment. VCO circuit 600 includes two VCO cells 510A and 510B, both of which are similar to VCO cell 510, previously described. The phase signal, transistor and other labels are omitted for clarity. VCO cell 510A includes a first decoupling capacitor 602, and VCO cell 510B includes a second decoupling capacitor 608. VCO circuit 600 is configured in a pseudo-differential configuration, wherein a first input voltage INp2 is applied to a first input resistor 604 to generate a first input current to VCO cell A second input voltage Inn2 is applied to a second input resistor 606 to generate a second input current to VCO cell 510B. The bias currents are provided to VCO cell 510A and VCO cell 510B by a multiple-output current mirror comprising PMOS transistors M11, M12, and M13. The sources of transistors M11, M12, and M13 are all coupled to the analog supply voltage source VDDA, in an embodiment. The input of the current mirror receives a bias current 610, a first output of the current mirror (drain of transistor M11) provides a first bias current to VCO cell 510A, and a second output of the current mirror (drain of transistor M12) provides a second bias current to VCO cell 510B. In an embodiment, the first and second bias currents can be equal in value to bias current 610.

The transistor-level schematics of FIG. 5 and FIG. 6 show VCO circuits that have been designed for implementation in deep submicron CMOS semiconductor technology. The VCO circuit of FIG. 5 has been designed using a single-ended configuration. The VCO circuit of FIG. 6 has been designed using a pseudo-differential configuration with two identical paths for accommodating a differential input signal, which further improves the power supply rejection ratio (PSRR) and distortion of the VCO circuit.

Figure 7A:
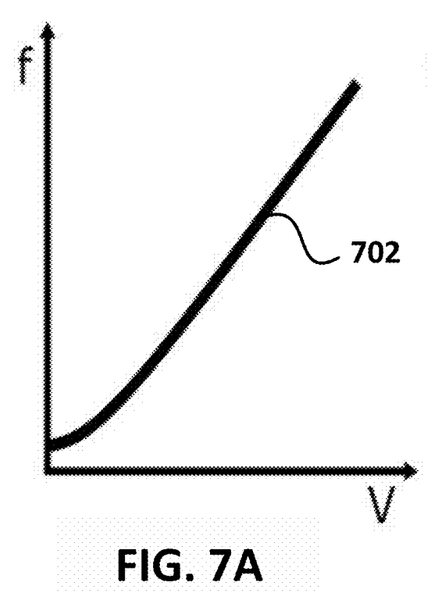
FIG. 7A is a plot of the voltage-frequency characteristics of an exemplary VCO.

FIG. 7A is a plot of the voltage-frequency characteristics 702 of an exemplary RO-VCO that does not include an embodiment FDR-based analog feedback path, but only includes a ring oscillator. It can be seen in FIG. 7A that the voltage-frequency characteristics 702 include a non-linearity, especially at lower input voltages.

Figure 7B:
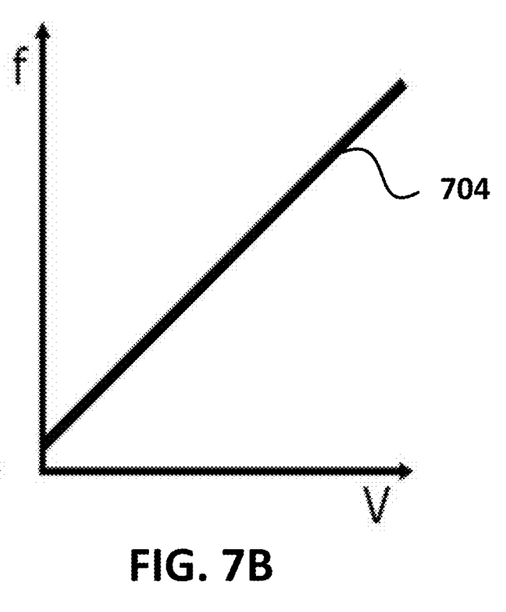
FIG. 7B is a plot of the voltage-frequency characteristic of a VCO including an analog feedback loop, according to an embodiment.

FIG. 7B is a plot of the voltage-frequency characteristic 704 of a RO-VCO comprising an analog feedback loop including the FDRs, according to an embodiment of the type shown in FIG. 3, FIG. 4, FIG. 5, and FIG. 6. It can be seen in FIG. 7B that the voltage-frequency characteristics 704 are advantageously more linear than the voltage-frequency characteristics 702 for all input voltages. Some embodiment RO-VCOs may advantageously substantially linear voltage-frequency characteristics.

Figure 8:
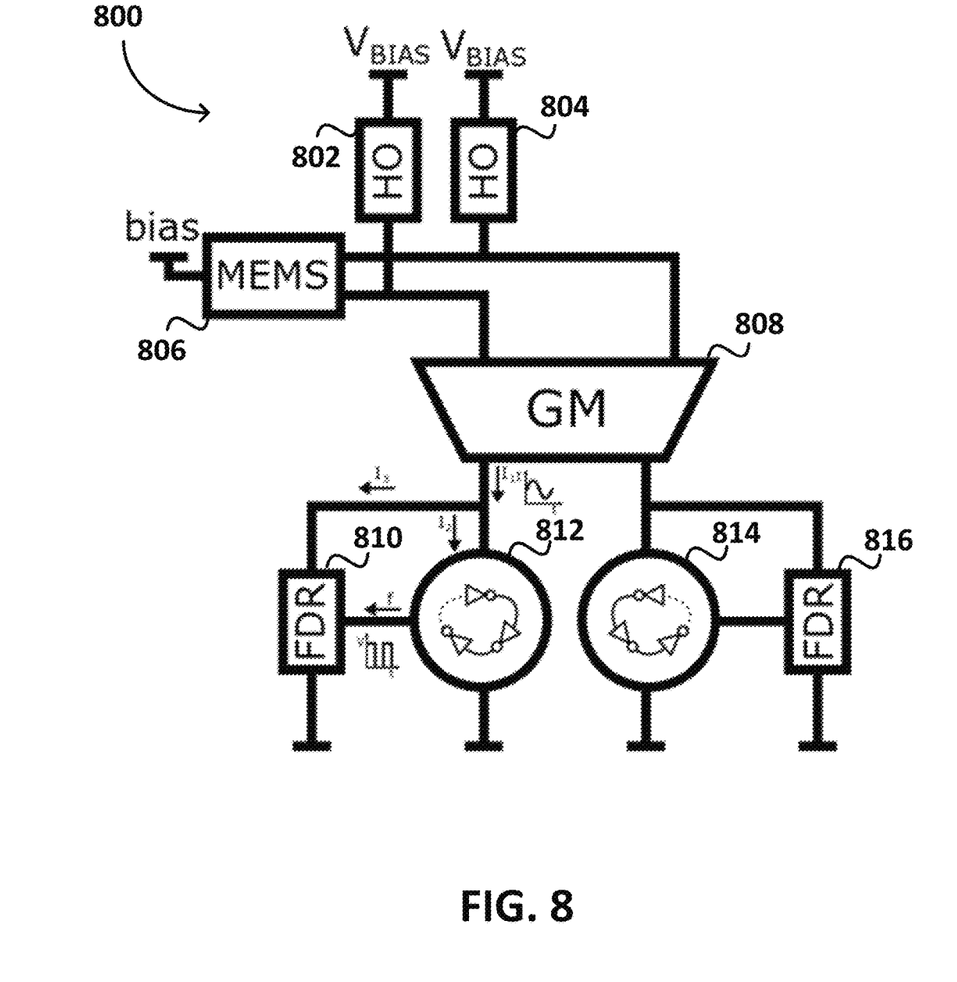
FIG. 8 is a block diagram of a VCO including an analog feedback loop, and also including a MEMS device and biasing circuitry, according to another embodiment.

FIG. 8 is a block diagram of a RO-VCO Boo including an analog feedback loop, and also including a MEMS device and biasing circuitry, according to another embodiment. In pertinent part RO-VCO includes a transconductance amplifier (GM) 808 for directly converting the voltages generated by MEMS device 806 into currents used by the VCO cells including FDR 810 and VCO 812, and VCO 814 and FDR 816. MEMS device 806 is biased by a "bias" voltage, and the voltage outputs are coupled to high ohmic resistors 802 and 804, that are in turn coupled to a "$V_{BIAS}$" bias voltage. The voltage outputs of MEMS device 806 are also coupled to the inputs of transconductance amplifier 808, which generates two output currents, in an embodiment. For example, a first output current L is split into a second current $I_2$ received by VCO 812, and a third current $I_3$ received by FDR 810. Another current is similarly generated and split between VCO 814 and FDR 816. While a pseudo-differential embodiment is shown in FIG. 8, a single-ended embodiment can also be used. Numerous transconductance amplifiers are known in the art. Any suitable transconductance amplifier can be used for transconductance amplifier 808.

Figure 9:
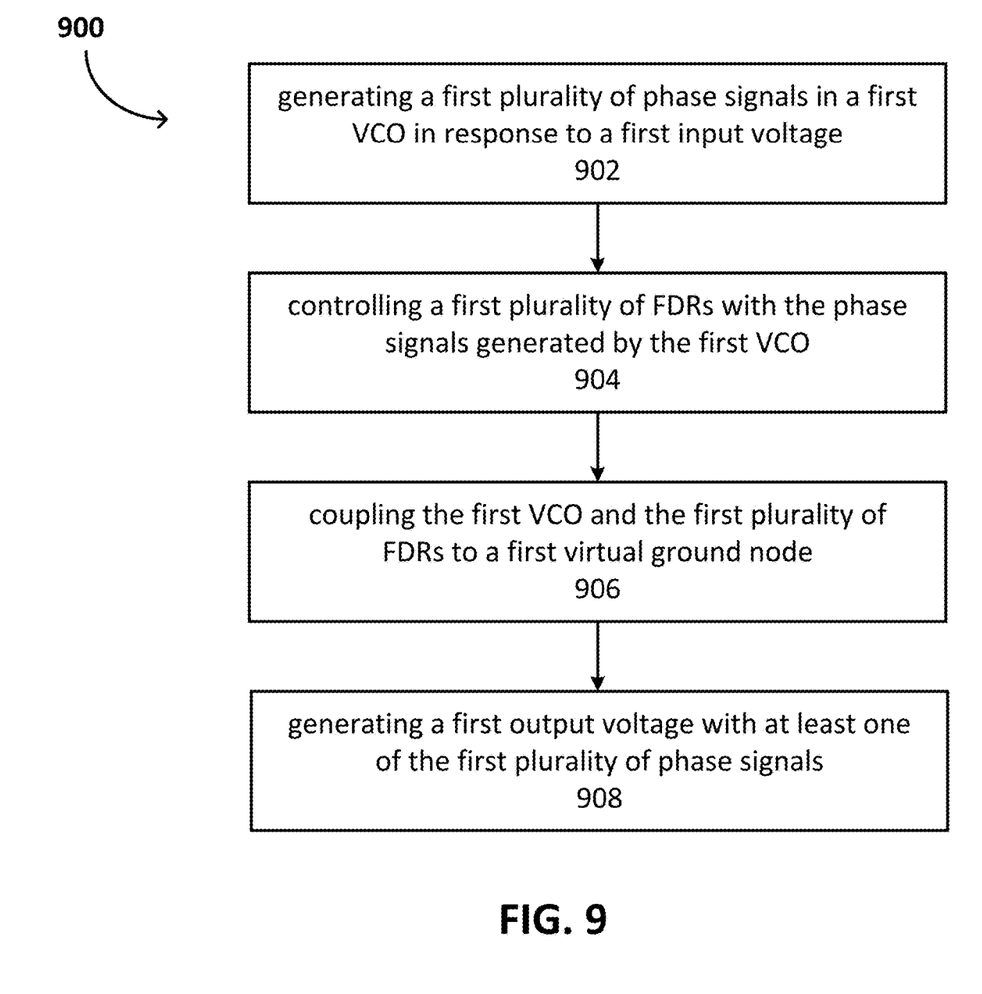
FIG. 9 is a block diagram of a method of operating a VCO with improved linearity, according to an embodiment.

FIG. 9 is a block diagram of a method 900 of operating a VCO with improved linearity, according to an embodiment. The method includes generating a first plurality of phase signals in a first voltage-controlled oscillator (VCO) in response to a first input voltage at step 902; controlling a first plurality of frequency-dependent resistors (FDRs) with the phase signals generated by the first VCO at step 904; coupling the first VCO and the first plurality of FDRs to a first feedback node at step 906; and generating a first output voltage with at least one of the first plurality of phase signals at step 908.

In summary, a RO-VCO comprising an FDR analog feedback has improved linearity when compared to a RO-VCO only comprising a ring of oscillators. According to embodiments, the RO-VCO described herein can be used in a VCO-ADC, which in turn can be used in a digital microphone also having improved linearity characteristics. Simulation results of a digital microphone comprising an embodiment VCO-ADC predicts a peak Signal-to-Noise Distortion Ratio (SNDR) of 82 dB at 107 dBspl (decibel sound pressure level), a SNDR of 70 dB at 94 dBspl and a dynamic range of nearly 100 dB with a power consumption of 80 μA at 1.5V. As previously described, embodiment RO-VCOs can be fabricated in deep submicron semiconductor processes, have improved linearity, and have power and size savings when compared to prior art RO-VCOs.

While embodiments of the ADC of the present invention have been described with respect to VCO-based embodiments, any of the VCOs shown and described herein such as VCO 302, VCO 402, and VCO cells 510A and 510B can be replaced with a controlled oscillator (CO) such as a current-controlled oscillator (CCO) in some embodiments.

Example embodiments of the present invention are summarized here. Other embodiments can also be understood from the entirety of the specification and the claims filed herein.

Example 1. According to an embodiment, an analog-to-digital converter (ADC) includes a first controlled oscillator (CO) configured for generating at least one phase signal, and wherein the at least one phase signal is configured for generating a first output signal of the ADC; and at least one first frequency-controlled resistor (FDR) configured for receiving the at least one phase signal generated by the first CO, wherein the first CO and the at least one first FDR are coupled together at a first subtraction node of the ADC, and wherein the first subtraction node is configured for receiving a first input signal.

Example 2. The ADC of Example 1, further including a second controlled oscillator (CO) configured for generating at least one phase signal, and wherein the at least one phase signal is configured for generating a second output signal of the ADC; and at least one second frequency-controlled resistor (FDR) configured for receiving the at least one phase signal generated by the second CO, wherein the second CO at the at least one FDR are coupled together at a second subtraction node of the ADC, and wherein the second subtraction node is configured for receiving a second input signal.

Example 3. The ADC of any of the previous examples, further including a first bias current generator coupled to the first subtraction node.

Example 4. The ADC of any of the previous examples, further including a second bias current generator coupled to the second subtraction node.

Example 5. The ADC of any of the previous examples, wherein the first bias current generator and the second bias current generator include a current mirror configured for receiving a reference bias current.

Example 6. The ADC of any of the previous examples, further including a first input resistor and/or a first capacitor between the first subtraction node and a source of the first input signal.

Example 7. The ADC of any of the previous examples, wherein the first input signal is generated by a sensor.

Example 8. The ADC of any of the previous examples, further including a divider interposed between the first CO and the at least one first FDR.

Example 9. The ADC of any of the previous examples, wherein the at least one first FDR includes an inverters loaded with a capacitor.

Example 10. The ADC of any of the previous examples, wherein the first CO and the at least one FDR are coupled between the first subtraction node and a reference node.

Example 11. According to an embodiment, a digital microphone includes a microelectromechanical system (MEMS) device; an application-specific integrated circuit (ASIC), wherein the ASIC includes an analog-to-digital converter (ADC) coupled to the MEMS device, and at least one digital signal processing component coupled to the ADC, wherein the ADC includes a first controlled oscillator (CO) coupled to a first plurality of frequency-controlled resistors (FDRs), configured for receiving phase signals generated by the first CO, and wherein the first CO and the first plurality of FDRs are coupled to a first subtraction node of the ADC.

Example 12. The digital microphone of Example 11, wherein the ADC further includes a second CO coupled to a second plurality of FDRs.

Example 13. The digital microphone of any of the previous examples, wherein the first CO includes a plurality of inverters.

Example 14. The digital microphone of any of the previous examples, wherein the first plurality of FDRs includes a plurality of inverters each loaded with a capacitor.

Example 15. The digital microphone of any of the previous examples, wherein the MEMS device and the ASIC are fabricated in a semiconductor package.

Example 16. According to an embodiment, a method includes generating a first plurality of phase signals in a first controlled oscillator (CO) in response to a first input signal; controlling a first plurality of frequency-dependent resistors (FDRs) with the phase signals generated by the first CO; coupling the first CO and the first plurality of FDRs to a first feedback node; and generating a first output signal with at least one of the first plurality of phase signals.

Example 17. The method of Example 16, further including generating a second plurality of phase signals in a second controlled oscillator (CO) in response to a second input signal; controlling a second plurality of frequency-dependent resistors (FDRs) with the phase signals generated by the second CO; coupling the second CO and the second plurality of FDRs to a second feedback node; and generating a second output signal with at least one of the second plurality of phase signals.

Example 18. The method of any of the previous examples, wherein the first CO includes a plurality of inverters.

Example 19. The method of any of the previous examples, wherein the first plurality of FDRs includes a plurality of inverters each loaded with a capacitor.

Example 20. The method of any of the previous examples, wherein the first CO includes a voltage-controlled oscillator (VCO) or a current-controlled oscillator (CCO).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter (ADC) comprising:
a first controlled oscillator (CO) configured for generating at least one phase signal, and wherein the at least one phase signal is configured for generating a first output signal of the ADC; and
at least one first frequency-controlled resistor (FDR) configured for receiving the at least one phase signal generated by the first CO,
wherein the first CO and the at least one first FDR are coupled together at a first subtraction node of the ADC, and wherein the first subtraction node is configured for receiving a first input signal.

2. The ADC of claim 1, further comprising:
a second controlled oscillator (CO) configured for generating at least one phase signal, and wherein the at least one phase signal is configured for generating a second output signal of the ADC; and
at least one second frequency-controlled resistor (FDR) configured for receiving the at least one phase signal generated by the second CO,
wherein the second CO at the at least one FDR are coupled together at a second subtraction node of the ADC, and wherein the second subtraction node is configured for receiving a second input signal.

3. The ADC of claim 2, further comprising a first bias current generator coupled to the first subtraction node.

4. The ADC of claim 3, further comprising a second bias current generator coupled to the second subtraction node.

5. The ADC of claim 4, wherein the first bias current generator and the second bias current generator comprise a current mirror configured for receiving a reference bias current.

6. The ADC of claim 1, further comprising a first input resistor and/or a first capacitor between the first subtraction node and a source of the first input signal.

7. The ADC of claim 1, wherein the first input signal is generated by a sensor.

8. The ADC of claim 1, further comprising a divider interposed between the first CO and the at least one first FDR.

9. The ADC of claim 1, wherein the at least one first FDR comprises an inverter loaded with a capacitor.

10. The ADC of claim 1, wherein the first CO and the at least one FDR are coupled between the first subtraction node and a reference node.

11. A digital microphone comprising:
a microelectromechanical system (MEMS) device;
an application-specific integrated circuit (ASIC), wherein the ASIC comprises an analog-to-digital converter (ADC) coupled to the MEMS device, and at least one digital signal processing component coupled to the ADC, wherein the ADC comprises a first controlled oscillator (CO) coupled to a first plurality of frequency-controlled resistors (FDRs), configured for receiving phase signals generated by the first CO, and wherein the first CO and the first plurality of FDRs are coupled to a first subtraction node of the ADC.

12. The digital microphone of claim 11, wherein the ADC further comprises a second CO coupled to a second plurality of FDRs.

13. The digital microphone of claim 11, wherein the first CO comprises a plurality of inverters.

14. The digital microphone of claim 11, wherein the first plurality of FDRs comprises a plurality of inverters each loaded with a capacitor.

15. The digital microphone of claim 11, wherein the MEMS device and the ASIC are fabricated in a semiconductor package.

16. A method comprising:
generating a first plurality of phase signals in a first controlled oscillator (CO) in response to a first input signal;
controlling a first plurality of frequency-dependent resistors (FDRs) with the phase signals generated by the first CO;
coupling the first CO and the first plurality of FDRs to a first feedback node; and
generating a first output signal with at least one of the first plurality of phase signals.

17. The method of claim 16, further comprising:
generating a second plurality of phase signals in a second controlled oscillator (CO) in response to a second input signal;
controlling a second plurality of frequency-dependent resistors (FDRs) with the phase signals generated by the second CO;
coupling the second CO and the second plurality of FDRs to a second feedback node; and
generating a second output signal with at least one of the second plurality of phase signals.

18. The method of claim 16, wherein the first CO comprises a plurality of inverters.

19. The method of claim 16, wherein the first plurality of FDRs comprises a plurality of inverters each loaded with a capacitor.

20. The method of claim 16, wherein the first CO comprises a voltage-controlled oscillator (VCO) or a current-controlled oscillator (CCO).

\* \* \* \* \*